SINE WAVE TO PULSE CONVERTER CIRCUIT

Filed Feb. 9, 1968

INVENTOR
CHARLES O. FORGE

BY A. C. Smith

ATTORNEY 3,534,201

SINE WAVE TO PULSE CONVERTER CIRCUIT

Charles O. Forge, Cupertino, Calif., assignor to Hewlett-Packard Company, Palo Alto, Calif., a corporation of California Filed Feb. 9, 1968, Ser. No. 704,316
Int. Cl. H03k 3/33
U.S. Cl. 307—281 2 Claims

ABSTRACT OF THE DISCLOSURE

Step recovery diodes are used to convert an applied periodic waveform into an output waveform in which the amplitude alternately dwells in one of two states and in which the amplitude and the dwell time in each amplitude state are independently variable.

SUMMARY OF THE INVENTION

The characteristic of step recovery diodes which results in continued conduction for a period subsequent to the application of a reverse current bias is utilized in the circuit to convert a periodic waveform into an output waveform in which the amplitude alternately dwells in one of two states and in which the amplitude and the dwell time in each amplitude state are independently variable.

DESCRIPTION OF THE PREFERRED EMBODIMENT

Figure 1:
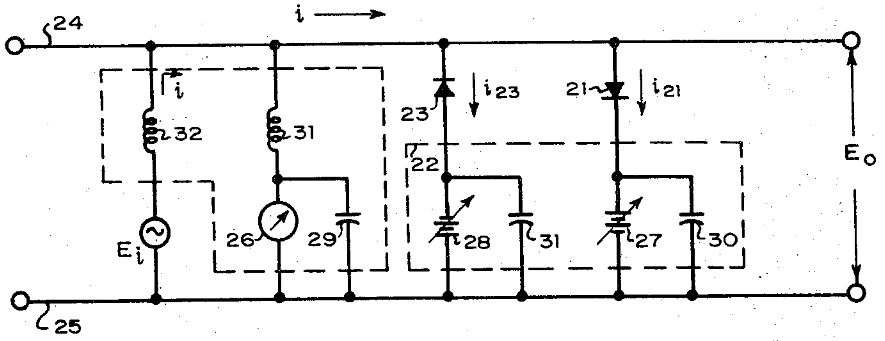
FIG. 1 is a schematic diagram of a circuit in accordance with the preferred embodiment of the present invention.

Referring to FIG. 1, there is shown a first step recovery diode 21 and a second step recovery diode 23 connected in conduction opposition across a pair of signal lines 24 and 25. The principal characteristic of step recovery diodes is that they continue to conduct for a period subsequent to the application of a reverse current bias. This reverse current bias conduction continues until the supply of carriers stored in the vicinity of the junction during the forward conduction period is depleted. When all the stored carriers are depleted, a rapid transition from the conduction state to the nonconduction state occurs (see FIGS. 2(*a*) and (*b*)). If the diodes 21 and 23 have long lifetimes compared to the period of the applied waveform $E_1$, all the charge stored during forward current conduction must be depleted by reverse current before the diode becomes nonconductive in each cycle.

The biasing means 22 consists of bias voltage sources 27 and 28 and their respective shunt bypass capacitors 30 and 31. Each diode is reverse current biased by the biasing means 22 if no waveform is applied at the input to the signal lines 24 and 25. Bias voltage source 26 is of lower potential than bias voltage source 27 and is of higher potential than bias voltage source 28. Thus, in the absence of any voltage applied across the signal lines 24 and 25, the application of bias voltage source 27 to the cathode of diode 21, bias voltage source 28 to the anode of diode 23, and bias voltage source 26 through the large inductor 31 to both the anode of diode 21 and the cathode of diode 23 results in the reverse biasing of both diodes. The periodic waveform is applied through the input means 1 to the common connection between the anode of diode 21 and the cathode of diode 23 through a large inductor 32 which has an impedance at the operating frequency that is many times larger than that of the sum of the output impedance of the circuit and the load impedance. Inductors 31 and 32, bias voltage source 26 and the shunt bypass capacitor 29 comprise the input means 1.

Figure 2A:
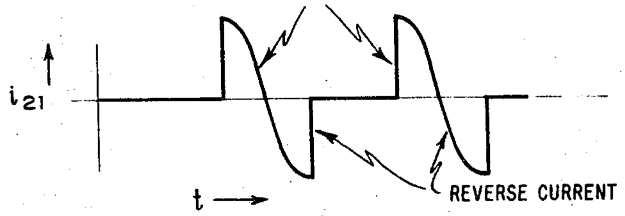
FIGS. 2*a*–2*d* are graphs showing the relationships between the currents existing in the step recovery diodes due to the applied periodic waveform and the output waveform produced by the circuit of FIG. 1.
Figure 2B:
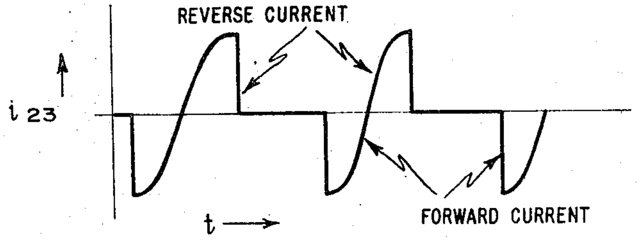
Figure 2C:
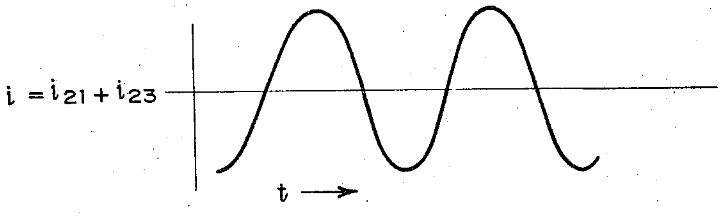
Figure 2D:
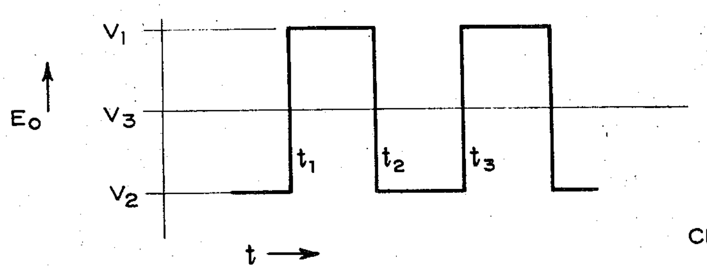

In this discussion, the voltage drop across diodes 21 and 23 is assumed to be zero during forward conduction and charge storage. If the impedance of the inductor 32 and the value of the applied waveform voltage $E_1$ are very large, current *i* flowing through the inductor 32 is nearly sinusoidal as seen in FIG. 2*c*. Since the current flow through inductor 31 is negligible, virtually all of the applied waveform current *i* flows through the first signal line 24. If the applied waveform voltage $E_1$ is very large in comparison with the value of bias voltages 27, 28 and 29, the voltage drop across the inductor 32 is nearly equal to the applied waveform voltage $E_1$. Thus, the inductor 32 and the applied waveform voltage $E_1$ are equivalent to a constant sinusoidal current source. Assuming the output to be an open circuit, the large instantaneous current *i* which is produced by the applied waveform voltage $E_1$ and the inductor 32 must flow through either diode 21 or 23 at every instant. Thus, at every instant, one diode is conductive and the other is nonconductive. This means that the output voltage $E_0$ must be equal to either the value of bias voltage 27 ($V_1$) or the value of bias voltage 28 ($V_2$). The output voltage $E_0$ is equal to $V_1$ while diode 21 is conductive and it is equal to $V_2$ while diode 23 is conductive (see FIG. 2(*d*) from time $t_1$ to $t_2$ and from time $t_2$ and $t_3$, respectively). Since step recovery diodes are used, even though one diode is reverse current biased it continues to be conductive until the other diode is forward biased and becomes conductive (see FIGS. 2(*a*) and (*b*)). Due to the application of the bias voltage 26 through inductor 31, however, the average output voltage $E_0$ must be equal to the value of bias voltage 26 ($V_3$). The only possible waveform which can satisfy these requirements is a pulse waveform that switches between amplitude states $V_1$ and $V_2$ and whose average value is $V_3$ (see FIG. 2(*d*)). The amplitude states may be varied by varying $V_1$ or $V_2$; the dwell time in each amplitude state may be varied by varying $V_3$.

Thus, the circuit converts an applied periodic waveform into an output waveform in which the amplitude alternately dwells in one of two states and in which the amplitude states and the dwell time in each amplitude state are independently variable.

What is claimed is:

1. Apparatus for converting an applied periodic waveform into an output waveform in which the amplitude alternately dwells in one of two states and in which the amplitude states and the dwell time in each amplitude state are independently variable, said apparatus comprising:

first and second signal lines connected to a pair of output terminals;

first and second step recovery diodes, each diode having an anode lead and a cathode lead;

means connecting the anode lead of said first step recovery diode and the cathode lead of said second step recovery diode to said first signal line;

a first bias voltage source serially connected with the first step recovery diode between the first and second signal lines for reverse biasing said first diode;

a second bias voltage source serially connected with the second step recovery diode between the first and second signal lines for reverse biasing said second diode;

a third bias voltage source;

a first inductor serially connecting the third bias voltage source between the first and second signal lines for varying the bias voltage across the first and second diodes by equal and opposite amounts; and input means connected across the signal lines for applying an input waveform to said signal lines.

2. Apparatus as in claim 1 comprising:

a second inductor connected to one of the first and second signal lines for applying an input waveform thereto.

References Cited

UNITED STATES PATENTS

| | | | |
|---|---|---|---|
| 3,076,902 | 2/1963 | Van Duzer et al. ---- | 307—281X |
| 3,299,294 | 1/1967 | Koehler ----------- | 307—281X |
| 3,309,532 | 3/1967 | Frye -------------- | 307—281X |

JOHN S. HEYMAN, Primary Examiner

U.S. Cl. X.R.

307—319